United States Patent [19]
Sato et al.

[11] Patent Number: 5,737,373
[45] Date of Patent: Apr. 7, 1998

[54] CONTROL METHOD AND APPARATUS FOR SUPPRESSING JITTER

[75] Inventors: Sakutaro Sato; Naonobu Fujimoto, both of Kawasaki, Japan

[73] Assignee: Fujitsu Limited, Kanagawa, Japan

[21] Appl. No.: 321,413

[22] Filed: Oct. 11, 1994

[30] Foreign Application Priority Data

Jan. 11, 1994 [JP] Japan .................................. 6-001113
Sep. 2, 1994 [JP] Japan .................................. 6-210022

[51] Int. Cl.⁶ .......................... H03L 7/00; H04L 29/00
[52] U.S. Cl. .................. 375/376; 375/371; 370/516; 370/517
[58] Field of Search .................... 375/371, 372, 375/373, 375, 376; 327/147, 151, 153, 156, 160, 161, 236; 370/505, 516–517

[56] References Cited

U.S. PATENT DOCUMENTS

| | | | |
|---|---|---|---|
| 4,599,579 | 7/1986 | McCann | 331/1 R |
| 4,746,870 | 5/1988 | Underhill | 331/1 R X |
| 4,996,698 | 2/1991 | Nelson | 375/363 X |
| 5,268,936 | 12/1993 | Bernardy | 375/376 X |
| 5,285,483 | 2/1994 | Ogawa et al. | 375/376 |
| 5,337,334 | 8/1994 | Molloy | 375/376 X |
| 5,402,452 | 3/1995 | Powell et al. | 370/516 X |
| 5,426,672 | 6/1995 | Volejnik | 375/371 |
| 5,497,126 | 3/1996 | Kosiec et al. | 375/376 X |

FOREIGN PATENT DOCUMENTS 2 117 199 10/1983 United Kingdom.
91/12678 8/1991 WIPO.

OTHER PUBLICATIONS

T1X1.3/93–006R1, ANS Draft T1.XXX–199X, Draft American National Standard for Telecommunications, Synchronous Optical Network (Sonet): Jitter at Network Interfaces.

*Primary Examiner*—Young T. Tse
*Attorney, Agent, or Firm*—Helfgott & Karas, P C.

[57] ABSTRACT

Provision is made of a phase-locked loop circuit including a voltage-controlled oscillator, a phase comparator, and a low-pass filter, a pulse-cancelling processing unit, a pulse-cancelling control unit, and a divider circuit. By dividing the pulse-cancelling request signal of the pointer-action into several bits by the divider circuit, the pulse-cancelling control unit gradually changes the input phase to the phase comparator or the control voltage to the voltage-controlled oscillator in several stages from the state before the 1-bit pulse-cancelling to the state of the 1-bit pulse-cancelling so that the phase of the output clock signal from the voltage-controlled oscillator matches the 1-bit pulse-cancelled input clock signal. By this, phase control of the output clock signal is performed in units of less than 1-bit and jitter is suppressed.

6 Claims, 13 Drawing Sheets

Fig.14A

| COUNTER OUTPUT | MARK RATE | REPETITIVE PATTERN SIGNAL |
|---|---|---|
| "00" → | 0/4 → | 00000000 --- |
| "01" → | 1/4 → | 10001000 --- |
| "10" → | 2/4 → | 10101010 --- |
| "11" → | 3/4 → | 11101110 --- |

Fig.14B

| AFTER REQUESTING PULSE-CANCELLING | COUNT VALUE | PULSE-CANCELLING CONTROL | OUTPUT FROM SECOND SELECTOR 52 |
|---|---|---|---|
| 1 | 1 |  | 1/4 PATTERN |
| 2 | 2 |  | 2/4 PATTERN |
| 3 | 3 |  | 3/4 PATTERN |
| 4 | 0 | EXECUTED | 0/4 PATTERN |

1

CONTROL METHOD AND APPARATUS FOR SUPPRESSING JITTER

BACKGROUND OF THE INVENTION

1. Field of the Invention

The present invention relates to a method and apparatus for suppressing jitter due to the pointer-action in an optical synchronous communication network.

Among the transmission systems in use, there are the synchronous digital hierarchy (SDH) transmission system and synchronous optical network (SONET) transmission system. At the present time, the industry is in a period of transition from asynchronous networks to synchronous networks and accordingly asynchronous and synchronous networks are mixed. Therefore, the digital hierarchy of an asynchronous network is transmitted mapped to the digital hierarchy of synchronous networks. When there is a difference between the frequencies of the master clocks between apparatuses in the synchronous networks, this is absorbed by a pointer-action corresponding to stuff/destuffing. In this case, demapping is performed at the terminating unit of the synchronous network so as to restore the digital hierarchy of the asynchronous network. At that time, however, it is necessary to suppress the sudden change in phase, i.e., jitter, induced by the pointer-action.

2. Description of the Related Art

As will be explained later in more detail, an input clock signal extracted from the received signal is given through a pulse-cancelling processing unit to a frequency dividing circuit where it is divided in 1/N. Also, an output clock signal from a voltage controlled oscillator is divided in 1/N by a frequency dividing circuit. These frequency-divided signals are compared in phase at a phase comparator and a compared output signal corresponding to the phase difference is passed through a low-pass filter and becomes the control voltage (control input) of the voltage-controlled oscillator. Looking at the pulse-cancelling processing unit, when pointer bytes H1 to H3 of the section overhead indicate for example a negative stuff, a 1-bit pulse-cancelling request signal dividing 1 byte into several times (for example, 8) is given from a pointer receiving circuit, and the pulse-cancelling processing unit performs 1-bit pulse-cancelling on the input clock signal.

The phase comparator compares the phase of the input clock signal obtained by frequency division from the frequency dividing circuit and the phase of the output clock signal from the voltage-controlled oscillator and controls the voltage-controlled oscillator so that the two phases match. By this control, even if there is 1-bit pulse-cancelling of an input clock signal by the pulse-cancelling processing unit, the phase of the output clock signal from the voltage-controlled oscillator changes following the input clock signal.

In recent years, however, there has been a demand for suppressing even jitter due to phase jumps of units of 1 bit. Therefore, it has been proposed to adopt a configuration in which a high speed input clock signal is introduced so as to suppress phase jumps of units of less than 1 bit. However, a high speed device which operates using a high speed input clock signal becomes necessary, so there are the problems of a high price and of a larger power consumption. Further, when there is no high speed input clock signal, it is necessary to provide a high frequency oscillator for generating such a high speed input clock signal in the phase locked loop circuit. This also creates the problem of a higher cost.

SUMMARY OF THE INVENTION

Therefore, the present invention has as its object the provision of a control method and apparatus for suppressing jitter due to pointer-action which enables jumps in phase to be suppressed in units of less than 1 bit without the use of a high speed input clock signal.

To attain the above object, the present invention provides a control apparatus provided with a phase-locked loop circuit including a voltage-controlled oscillator, a phase comparator, and a low-pass filter, a pulse-cancelling processing unit, a pulse-cancelling control unit, and a divider circuit. By dividing the pulse-cancelling request signal of the pointer-action into several bits by the divider circuit, the pulse-cancelling control unit gradually changes the input phase to the phase comparator or the control voltage to the voltage-controlled oscillator in several stages from the state before the 1-bit pulse-cancelling to the state of the 1-bit pulse-cancelling so that the phase of the output clock signal from the voltage-controlled oscillator matches the 1-bit pulse-cancelling input clock signal.

BRIEF DESCRIPTION OF THE DRAWINGS

The above object and features of the present invention will be more apparent from the following description of the preferred embodiments with reference to the accompanying drawings, wherein:

FIGS. 14A and 14B are explanatory views of a pulse-cancelling control of the fourth embodiment.

DESCRIPTION OF THE PREFERRED EMBODIMENTS

Before describing the embodiments of the present invention, the related art and the disadvantages therein will be described with reference to the related figures.

Figure 1:
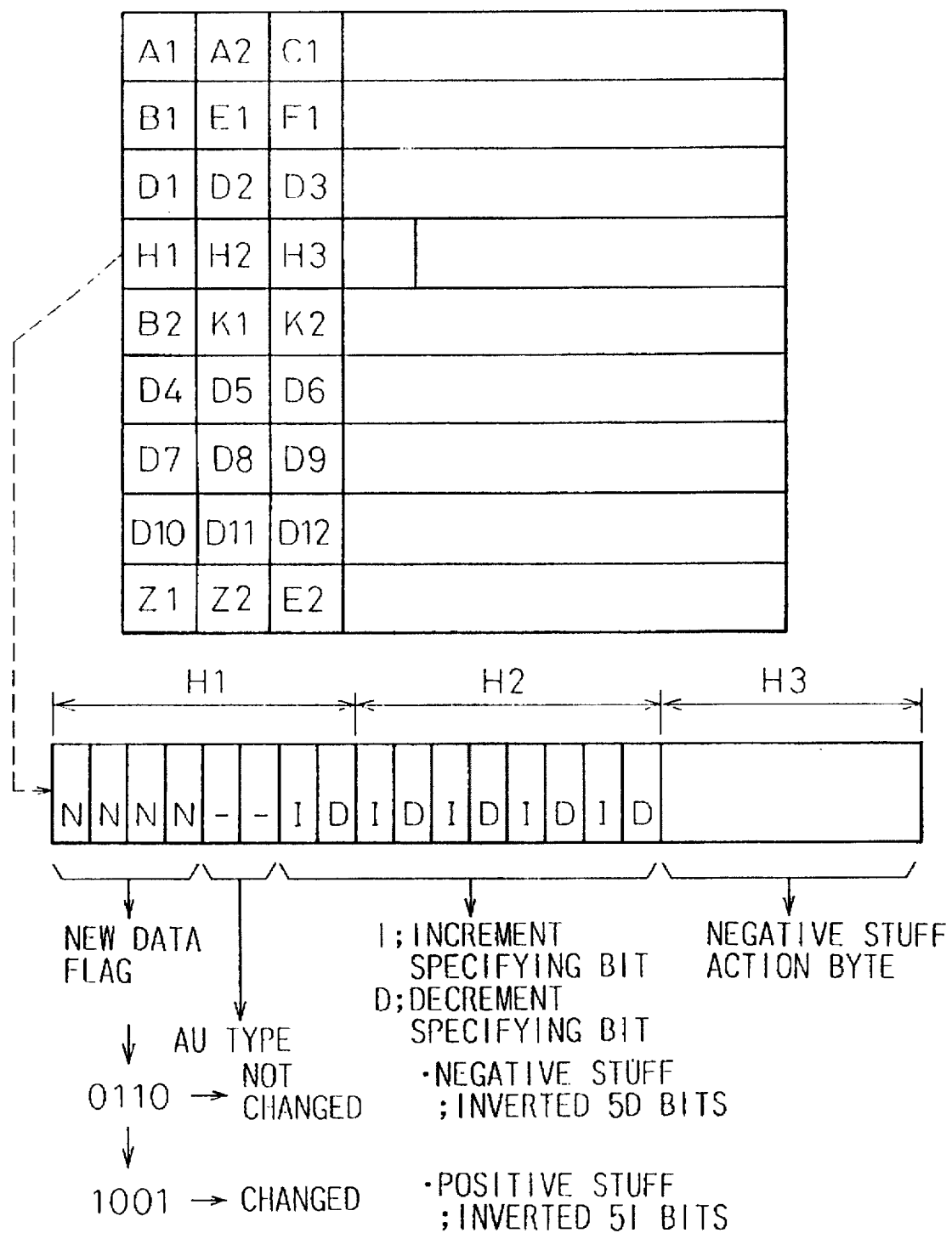
FIG. 1 is an explanatory view of a pointer.

FIG. 1 is an explanatory view of a pointer. It shows a section overhead of STS-1 in the SONET transmission system or STM-0 in the SDH transmission system. A1 and A2 are frame synchronization bytes, C1 is an identification byte, B1 is an error monitoring byte, E1 is an order-wire byte, F1 is a user channel byte, D1 to D3 are data communication channel bytes, H1 to H3 are pointer bytes, B2 is an error monitoring byte, K1 and K2 are automatic protection switch (APS) control bytes, D4 to D12 are data communication channel bytes, Z1 and Z2 are growth bytes, and E2 is an order-wire byte.

The pointer bytes H1 to H3 are determined as shown at the bottom of FIG. 1. The 4-bit configuration N in the pointer byte H1 is a "new data" flag. "0110" indicates there has been no change, while "1001" indicates there has been a change. The next 2 bits are S-bits indicating the administrative unit (AU) type. "10" indicates AU-4 or AU-3. The 10 bits of the next 2 bits and the pointer byte H2 indicate the pointer value, with I indicating an increment specifying bit and D a decrement specifying bit. The pointer byte H3 is a negative stuff action byte. When a large number of the D bits invert, a negative stuff is indicated, while when a large number of I bits invert, a positive stuff is indicated. A positive stuff uses the adjoining byte of the pointer byte H3.

A phase jump of 1-byte units occurs due to the pointer action. Due to this, jitter is induced as mentioned earlier. Accordingly, a phase locked loop (PLL) circuit is used to enable phase control in units of 1 bit or less than 1 bit so as to suppress the jitter.

Figure 2:
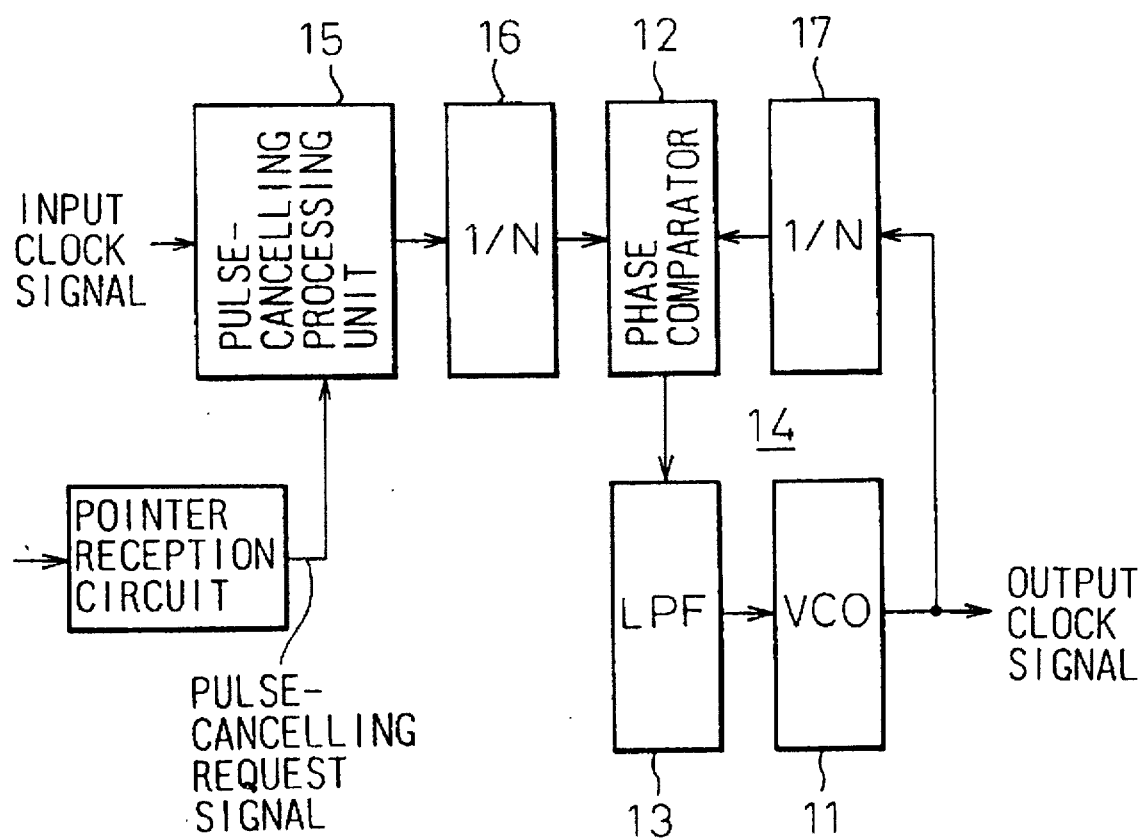
FIG. 2 is an explanatory view of a related art.

FIG. 2 is an explanatory view of a related art, wherein 11 is a voltage-controlled oscillator (VCO), 12 is a phase comparator, 13 is a low-pass filter (LPF), 14 is a phase locked loop (PLL) circuit, 15 is a pulse-cancelling processing unit, and 16 and 17 are frequency dividing (1/N) circuits. Note that illustration of the extraction unit for the clock signal and the extraction-decision unit of the section overhead (SOH) is omitted.

An input clock signal extracted from the received signal is given through the pulse-cancelling processing unit 15 to the frequency dividing circuit 16 where it is divided in 1/N. Also, an output clock signal from the voltage-controlled oscillator 11 is divided in 1/N by the frequency dividing circuit 17. These frequency-divided signals are compared in phase at the phase comparator 12 and a compared output signal corresponding to the phase difference is passed through the low-pass filter 13 and becomes the control voltage (control input) of the voltage-controlled oscillator 11. Looking at the pulse-cancelling processing unit 15, when pointer bytes H1 to H3 of the section overhead indicate for example a negative stuff, a 1-bit pulse-cancelling request signal dividing 1 byte into several times (for example, 8) is given from a pointer receiving circuit, and the pulse-cancelling processing unit 15 performs 1-bit pulse-cancelling on the input clock signal.

The phase comparator 12 compares the phase of the input clock signal obtained by frequency division from the frequency dividing circuit 16 and the phase of the output clock signal from the voltage-controlled oscillator 11 and controls the voltage-controlled oscillator 11 so that the two phases match. By this control, even if there is 1-bit pulse-cancelling of an input clock signal by the pulse-cancelling processing unit 15, the phase of the output clock signal from the voltage-controlled oscillator 11 changes following the input clock signal.

Figure 3:
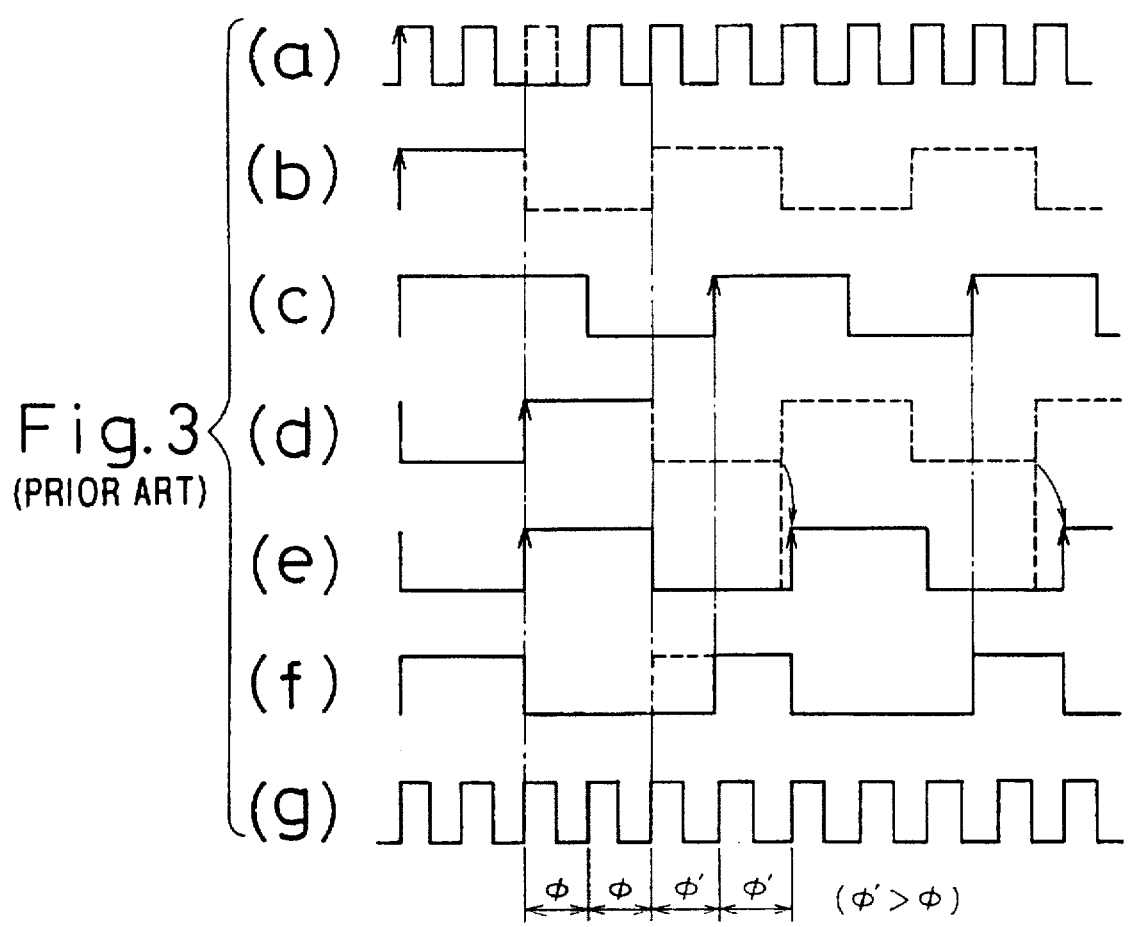
FIG. 3 is an explanatory view of the operation of the related art.

FIG. 3 is an explanatory view of the operation of the related art, in which (a) shows the input clock signal coming from the pulse-cancelling processing unit 15 and shows a 1-bit pulse-cancelling by the broken line. Further, (b) and (c) show output signals of the frequency dividing circuit 16 when N=4, with (b) showing the output signal in the case where 1-bit pulse-cancelling is not performed and (c) the output signal in the case where 1-bit pulse-cancelling is performed. Further, (d) and (e) are output signals of the frequency dividing circuit 17 in the case of N=4, m where (d) shows the output signal in the case where 1-bit pulse-cancelling is not performed and (e) the output signal in the case where 1-bit pulse-cancelling is performed. Further, (f) shows the output signal of the phase comparator 12, and (g) shows the output signal of the voltage-controlled oscillator 11.

When the pulse-cancelling processing unit 15 performs a 1-bit pulse-cancelling operation on the input clock signal in accordance with a pulse-cancelling request signal, the output signal of the frequency dividing circuit 16 changes from (b) to (c). Accordingly, the phase compared output signal of the phase comparator 12 loses the portion of the broken line of (f), so the control voltage coming through the low pass filter 13 falls and the frequency of the output clock signal from the voltage-controlled oscillator 11 falls as shown in (g) and the phase of the 1-bit pulse-cancelled input clock signal is synchronized with.

As explained above, when a pointer-action is detected by the pointer reception circuit shown in FIG. 2, the 1 byte is divided into 1 bit units and pulse-cancelling of the input clock signal is performed so that it is possible to make the 1-byte unit phase jumps 1-bit units. In recent years, however, there has been a demand for suppressing even jitter due to phase jumps of units of 1 bit. Therefore, it has been proposed to adopt a configuration in which a high speed input clock signal is introduced so as to suppress phase jumps of units of less than 1 bit. However, a high speed device which operates using a high speed input clock signal becomes necessary, so there are the problems of a high price and of a larger power consumption. Further, when there is no high speed input clock signal, it is necessary to provide a high frequency oscillator for generating such a high speed input clock signal in the phase locked loop circuit. This also creates the problem of a higher cost. Therefore, the present invention provides a control method and apparatus for suppressing jitter due to pointer-action which enables jumps in phase to be suppressed in units of less than 1 bit without the use of a high speed input clock signal.

Figure 4:
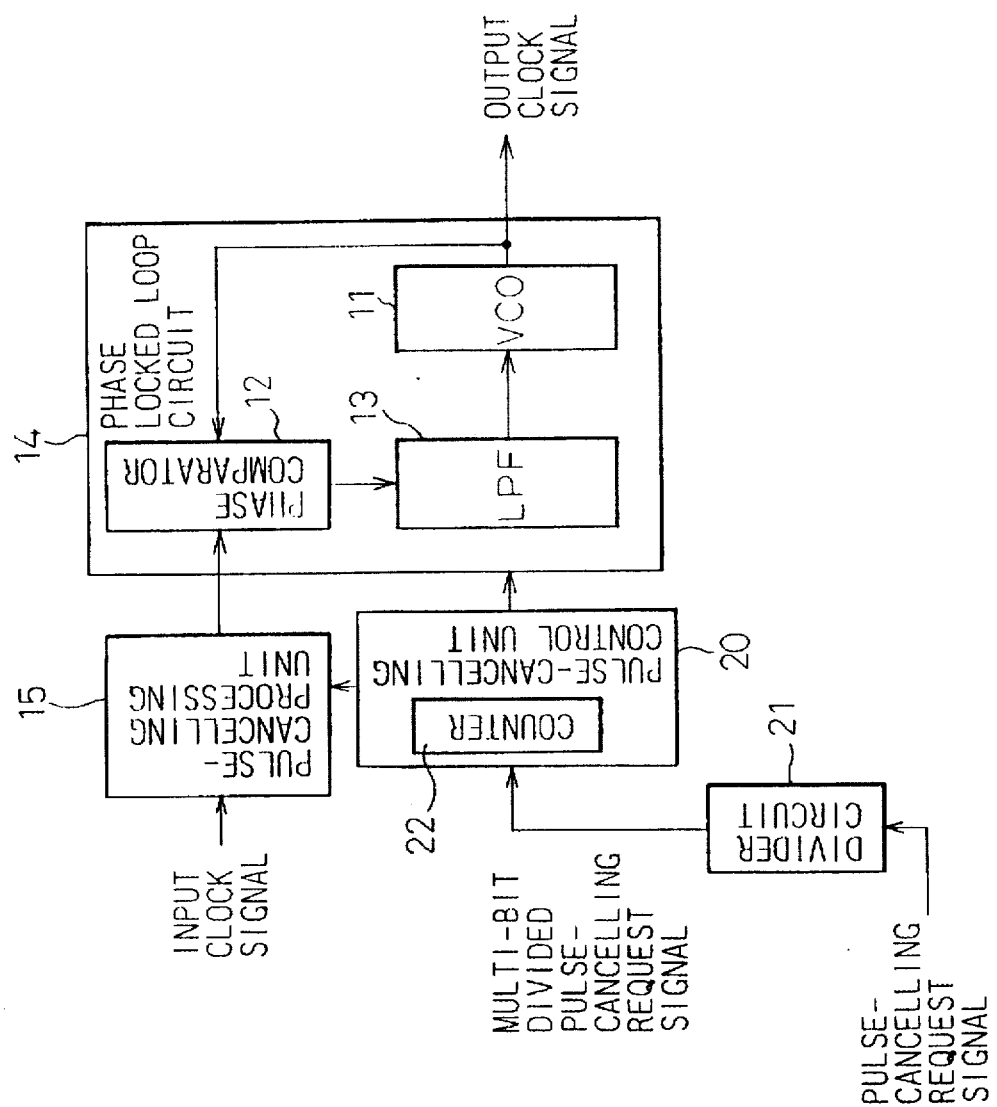
FIG. 4 is an explanatory view of the principle of the present invention.

FIG. 4 is an explanatory view of the principle of the present invention.

In the first aspect of the present invention, there is provided a control method for suppressing jitter, induced by a pointer-action, by providing a pulse-cancelling processing unit 15 which, when an input clock signal is received and a pointer-action is generated, receives a pulse-cancelling request signal given in response to that pointer-action and outputs the input clock signal after performing a 1-bit pulse-cancelling operation on it and a circuit for receiving as input the output from the pulse-cancelling processing unit 15 and producing an output clock signal phase-locked to that output, that is, a phase-locked loop circuit 14 comprised of a phase comparator 12 for comparing the phases between the output and the output clock signal, a low-pass filter 13 for receiving the output of the phase comparator 12, and a voltage-controlled oscillator 11 for receiving as the voltage-controlling input the output of the low-pass filter 13 and producing the output clock signal, wherein when one pulse-cancelling request signal is given, this is divided into a consecutive number of bits and converted to multi-bit divided pulse-cancelling request signals and wherein the phase locked state in the phase locked loop circuit 14 is gradually changed in several stages from the state before the 1-bit pulse-cancelling to the state of the 1-bit pulse-cancelling at the timings of the consecutive multi-bit divided pulse-cancelling request signals.

According to the first aspect, the sudden changes in phase of the output clock signal from the phase locked loop circuit 14 induced by the 1-bit pulse-cancelling processing on the input clock signal are eliminated and the phase change of the output clock signal accompanying the 1-bit pulse-cancelling processing is gradually proceeded with so as to suppress the generation of jitter caused by the pointer-action.

In the second aspect of the present invention, there is provided a control apparatus for suppressing jitter, induced by a pointer-action, provided with a pulse-cancelling processing unit 15 which, when an input clock signal is received and a pointer-action is generated, receives a pulse-cancelling request signal given in response to that pointer-action and outputs the input clock signal after performing a 1-bit pulse-cancelling operation on it and a circuit for receiving as input the output from the pulse-cancelling processing unit 15 and producing an output clock signal phase-locked to that output, that is, a phase-locked loop circuit 14 comprised of a phase comparator 12 for comparing the phases between the output and the output clock signal, a low-pass filter 13 for receiving the output of the phase comparator 12, and a voltage-controlled oscillator 11 for receiving as the voltage-controlling input the output of the low-pass filter 13 and producing the output clock signal, wherein further provision is made of a divider circuit 21 which, when one pulse-cancelling request signal is given, divides this into a consecutive number of bits and converts to multi-bit divided pulse-cancelling request signals and a pulse-cancelling control unit 20 which gradually changes the phase locked state in the phase locked loop circuit 14 in several stages from the state before the 1-bit pulse-cancelling to the state of the 1-bit pulse-cancelling at the timings of the consecutive multi-bit divided pulse-cancelling request signals.

According to the second aspect, to cause the phase change to proceed gradually as mentioned above, first multi-bit divided pulse-cancelling request signals are generated by the frequency dividing circuit 21 and the pulse-cancelling control unit 20 is driven based on this series of signals.

In the third aspect of the present invention, the pulse-cancelling control unit 20 is provided with a counter means 22 which receives the multi-bit divided pulse-cancelling request signals and successively sets a plurality of states for gradually changing the phase locked state in the phase locked loop circuit 14 from the state before the 1-bit pulse-cancelling processing to the state of the 1-bit pulse-cancelling.

Figure 5:
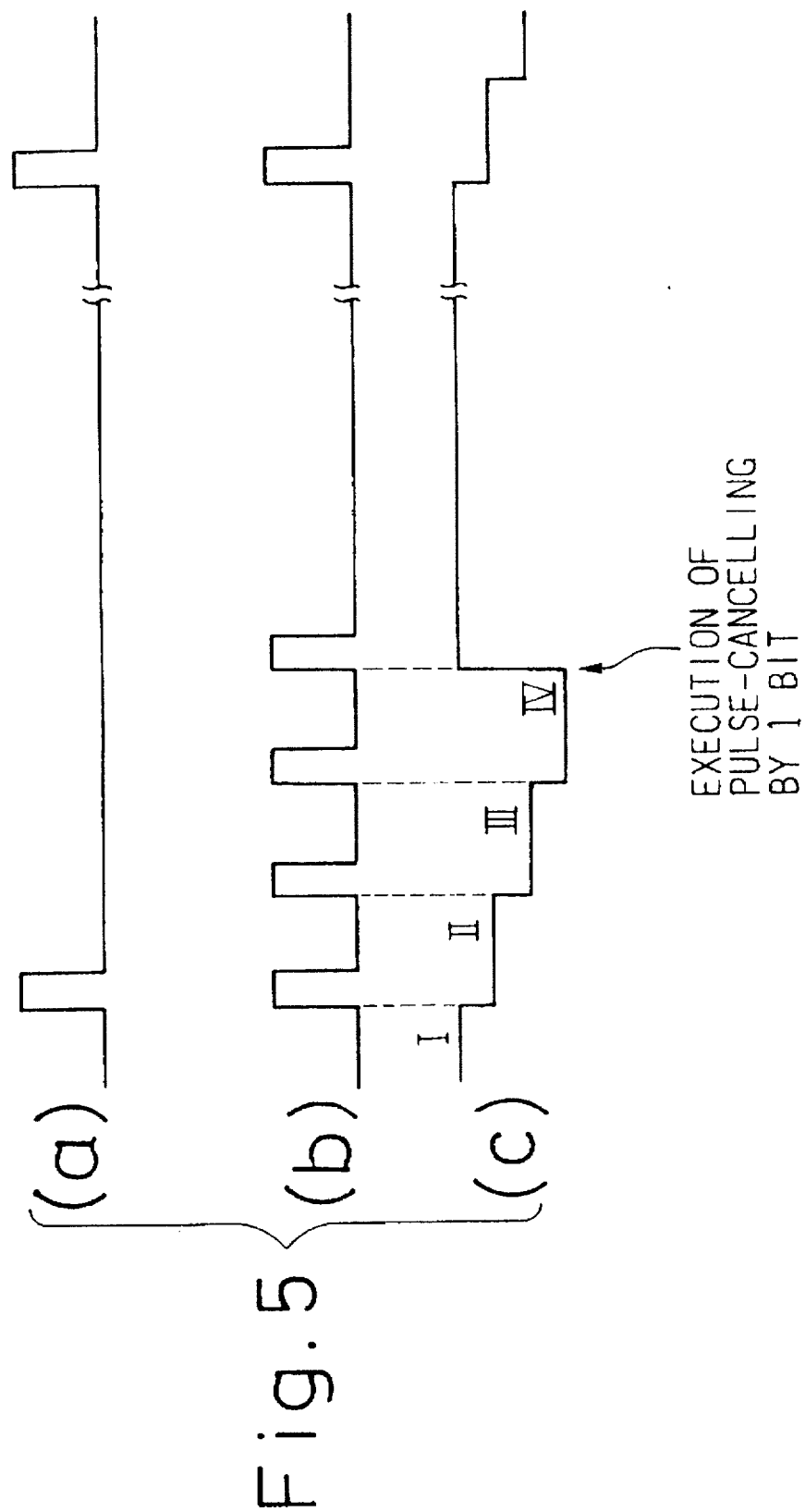
FIG. 5 is a view schematically showing the basic operation of the present invention.

According to the third aspect, to cause the phase change to proceed gradually, the counter means 22 is used to form a plurality of stages of gradual change in the phase locked loop circuit 14. This is schematically shown in FIG. 5. First, as shown in column (a), when a pulse-cancelling request signal is given due to a point-action, this is received by the divider circuit 21 and then, as shown by the column (b), multi-bit divided pulse-cancelling request signals are generated. Note that in the figure, an example of a 4-bit division is shown, but a 2-bit division, 6-bit division, or 8-bit division are also possible.

In the phase locked loop circuit 14, in the past, when the internal state changed rapidly from the state I of column (c) to state IV, there would be a gradually change from state I to state II to state III and then to state IV keeping pace with the multi-bit divided pulse-cancelling request signals.

In the fourth aspect of the present invention, the pulse-cancelling control unit 20 is constituted so as to make the control voltage of the voltage-controlled oscillator 11 a step-like offset voltage for gradually changing from the state before the 1-bit pulse-cancelling processing to the state of the 1-bit pulse-cancelling.

According to the fourth aspect, the pulse-cancelling control unit 20 controls the pulse-cancelling processing unit 15 upon receipt of the pulse-cancelling request signal due to the pointer-action and causes the 1-bit pulse-cancelling processing to be performed and outputs an offset voltage which gradually changes over several stages. This offset voltage passes through the phase comparator 12 or low-pass filter 13 and is added to the control voltage to the voltage-controlled oscillator 11. By this, the phase of the output clock signal of the voltage-controlled oscillator 11 can be gradually synchronized with the phase of the 1-bit pulse-cancelled input clock signal from the state before the 1-bit pulse-cancelling to the state of the 1-bit pulse-cancelling.

In the fifth aspect of the present invention, the pulse-cancelling control unit 20 is provided with a variable delay circuit 41 set between the pulse-cancelling processing unit 15 and the phase comparator 12 in the phase locked loop circuit 14, by which variable delay circuit 41 the input clock signal is successively delayed in a plurality of stages until the 1-bit pulse-cancelled state, the 1-bit pulse-cancelling processing is performed at the pulse-cancelling processing unit 15 in the 1-bit pulse-cancelled state, and the variable delay circuit 41 is then returned to its original state.

According to the fifth aspect of the present invention, the pulse-cancelling control unit 20 performs control based on the pulse-cancelling request signal due to the pointer-action so that the delay time by the variable delay circuit 41 is gradually extended. At the same time as a pulse-cancelling request signal corresponding to 1 bit of the input clock signal is received, it controls the pulse-cancelling processing unit 15 to cause it to perform the 1-bit pulse-cancelling processing of the input clock signal and resets the delay time to 0. Accordingly, the input clock signal to the phase locked loop circuit 14 is gradually delayed in phase and becomes the 1-bit pulse-cancelled state, so the phase of the output clock signal of the voltage-controlled oscillator 11 can be made to gradually change to the 1-bit pulse-cancelled state without rapidly changing.

In the sixth aspect of the present invention, the pulse-cancelling control unit 20 is provided with a first selector 51 which selects and outputs either of the input clock signal from the pulse-cancelling processing unit 15 delayed by a delay circuit 53 or an input clock signal not so delayed, a pattern-generator 54 for generating a plurality of types of repetitive patterns with successively different mark rates, and a second selector 52 which selects and outputs either of the plurality of types of repetitive pattern signals from the pattern generator 54 and uses the same as the selection control signal of the first selector 51, wherein by selection control of the second selector 52 over several stages, the delayed input clock signal and the undelayed input clock signal are input to the phase locked loop circuit 14 in the ratio in accordance with the mark ratio from the first selector 51.

According to the sixth aspect of the present invention, a plurality of types of repetitive pattern signals with successively different mark ratios are generated from the pattern generator 54. The first selector 51 selects and outputs either the delayed input clock signal or the undelayed input clock signal in accordance with the repetitive pattern signal and inputs the same to the phase locked loop circuit 14. In the phase locked loop circuit 14, the phase of the output clock signal from the voltage-controlled oscillator 11 changes in accordance with the mark ratio of the repetitive pattern signal. This phase change of the output clock signal becomes a relatively high frequency component, so can be easily eliminated by a later filter. Accordingly, by causing a successive change in the mark ratio from the state before the 1-bit pulse-cancelling of the input clock signal to the state of the 1-bit pulse-cancelling, it is possible to gradually cause the phase of the output clock signal from the voltage-controlled oscillator 11, on the average, to synchronize with the phase of the 1-bit pulse-cancelled input clock signal.

In the seventh aspect of the present invention, the pulse-cancelling control unit 20 successively raises over several stages the ratio of selection of the delayed input clock signal by the first selector 51, then performs 1-bit pulse-cancelling processing on the input clock signal at the pulse-cancelling processing unit 15 and returns the ratio of selection of the delayed input clock signal to zero.

According to the seventh aspect of the present invention, the pulse-cancelling control unit 20 controls the selection rate of the delay input clock signal input from the first selector 51 to the phase locked loop circuit 14 due to the pulse-cancelling request signal caused by the pointer-action to first become low and then gradually become high. Accordingly, the input clock signal input to the phase locked loop circuit 14 on the average first has a small delay, then gradually a larger one. Due to this, the phase of the output clock signal from the voltage-controlled oscillator 11 changes following this. When the selection rate of the delayed input clock signal becomes highest, the pulse-cancelling processing unit 15 is controlled to perform 1-bit pulse-cancelling processing on the input clock signal. At that point of time, the phase of the input clock signal to the phase locked loop circuit 14 after 1-bit pulse-cancelling is close to the phase at the time of the state of the 1-bit pulse-cancelling, so no rapid changes occur in the phase of the output clock signal.

Figure 6:
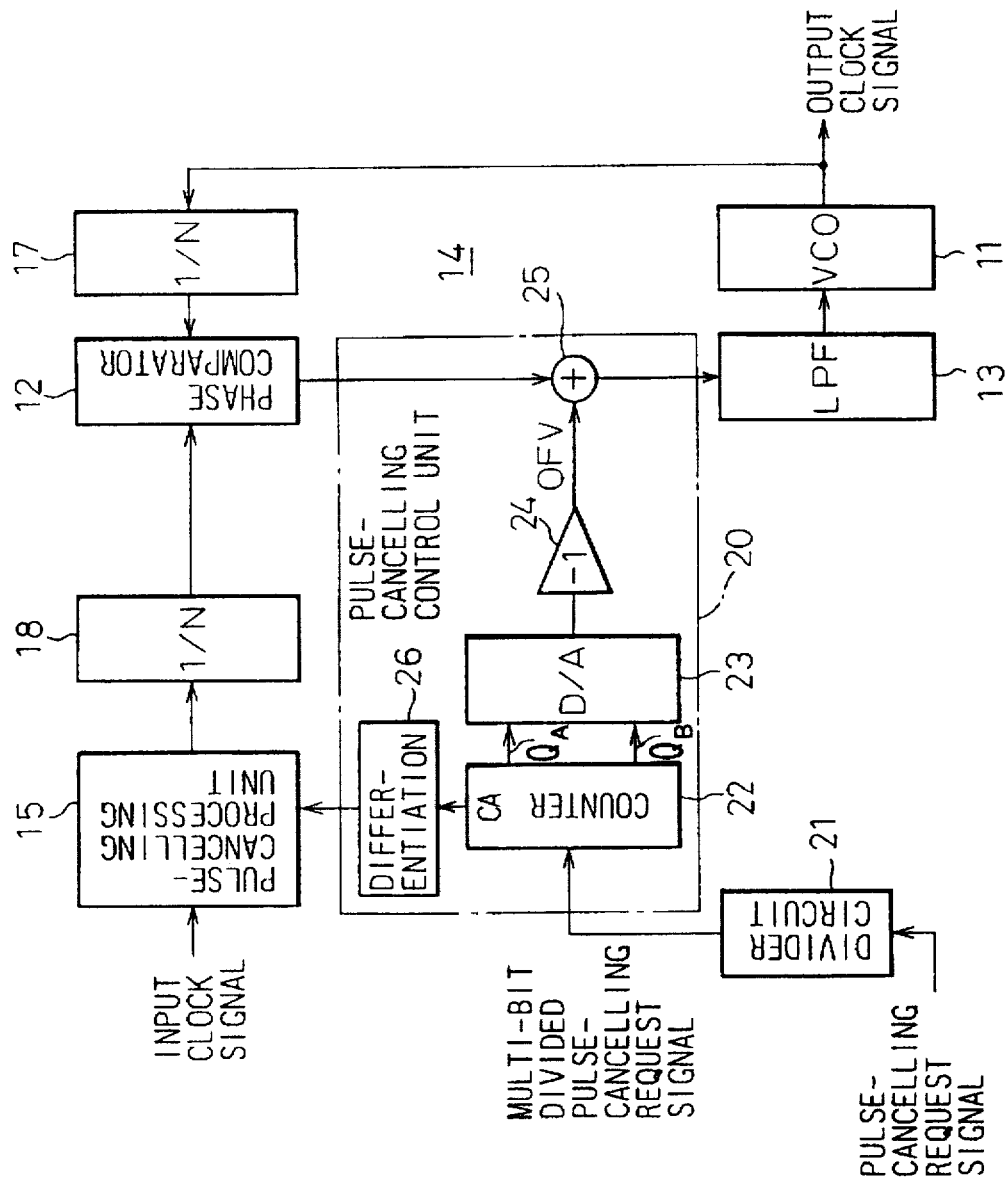
FIG. 6 is an explanatory view of a first embodiment of the present invention.

FIG. 6 is an explanatory view of a first embodiment of the present invention, in which 11 is a voltage-controlled oscillator, 12 is a phase comparator, 13 is a low-pass filter, 14 is a phase locked loop circuit, 15 is a pulse-cancelling processing unit, 20 is a pulse-cancelling control unit, 17 and 18 are frequency dividing (1/N) circuits, 22 is a counter means, 23 is a D/A converter, 24 is an inverting buffer amplifier, 25 is an adder, and 26 is a differentiation circuit.

The input clock signal is given through the pulse-cancelling processing unit 15 to the frequency dividing circuit 18. For example, if N=4, it is divided in ¼ and given to the phase comparator 12. Further, the output signal from the voltage-controlled oscillator 11 is divided in frequency in 1/N, for example, ¼, by the frequency dividing circuit 17 and applied to the phase comparator 12. The phase compared output signal from the phase comparator 12 is applied through the adder 25 to the low pass filter 13. The control voltage is applied from the low-pass filter 13 to the voltage-controlled oscillator 11.

The pulse-cancelling request signal after the pointer-action, from the pointer received circuit shown in FIG. 2, becomes the multi-bit (4-bit) divided pulse-cancelling request signals. When applied to the counter means 22 of the pulse-cancelling control unit 20, the counter means 22 controls the pulse-cancelling processing unit 15 after the elapse of a predetermined time so as to perform the 1-bit pulse-cancelling processing of the input signal. Here, in the pulse-cancelling control unit 20, the multi-bit divided pulse-cancelling request signals are counted by the counter means 22 and the count is converted to an analog voltage by the D/A converter 23. If the multi-bit division is made 4-bit division, then the 2-bit output ($Q_A$, $Q_B$) of the 4-bit counter 22 is incremented as (0,0) to (0,1) to (1,0) and (1,1). In accordance with this, the analog voltage from the D/A converter changes from 0V to 1V to 2V and 3V.

The analog voltage is applied to the adder 25 by the inverting buffer amplifier 24 as 0V to −1V to −2V and −3V and added to the phase compared output signal of the phase comparator 12. When the outputs ($Q_A$, $Q_B$) of the counter means 22 return to (0,0), the carry-out output CA is generated and is passed through the differentiation circuit 26 to the pulse-cancelling processing unit 15. Accordingly, the control signal obtained by adding the offset voltage OFV from the inverting buffer amplifier 24 to the phase compared output signal obtained from the 1 bit pulse-cancelling of the input clock signal is applied to the voltage-controlled oscillator 11. This offset voltage is obtained by causing a gradual change over several stage, so the phase of the output clock signal from the voltage-controlled oscillator 11 is made to gradually change. When the 1 bit pulse-cancelling of the input clock signal is executed by the pulse-cancelling processing unit 15, the phase of the output clock signal is already changed to the state of the 1 bit pulse-cancelling. Accordingly, it is possible to suppress jitter caused by the 1-bit pulse-cancelling.

Note that the differentiation circuit 26 is provided for the carry-out output CA of the counter means 22 to ensure that just the 1 bit of the input clock signal is reliably removed regardless of the size of the pulse width of the CA.

Figure 7:
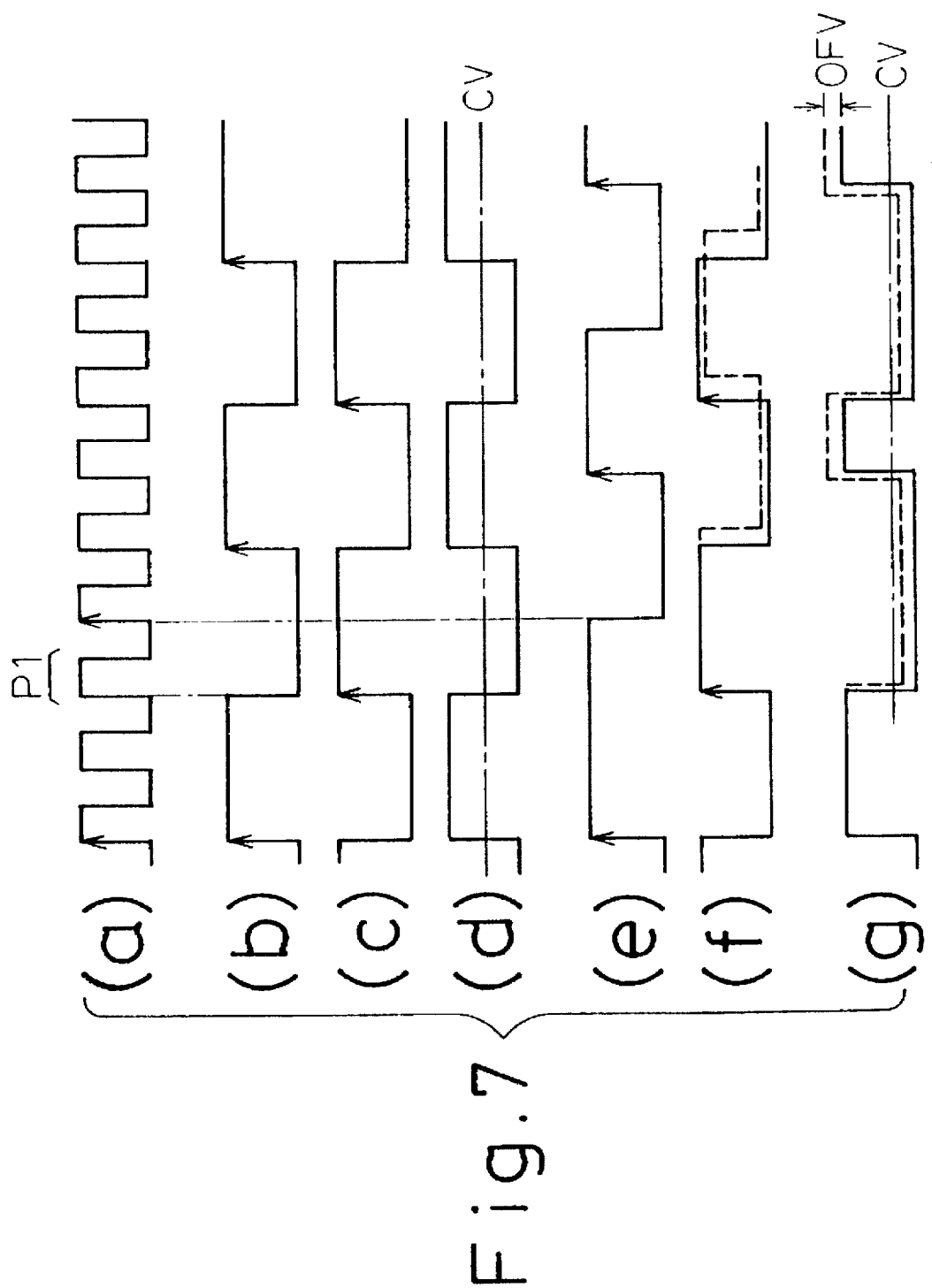
FIG. 7 is an explanatory view of the operation of the first embodiment of the present invention.

FIG. 7 is an explanatory view of the operation of the first embodiment of the present invention, wherein (a) shows an input clock signal, (b) shows an input clock signal divided in ¼ by the frequency divider 18, (c) is an output clock signal divided in ¼ by the frequency divider 17, and (d) is a phase comparison output signal of the phase comparator 12. Further, (e) shows an input clock signal divided in ¼ at the time of a pulse-cancelling processing performed on the 1 bit P1 of the input clock signal of (a), (f) shows an output clock signal divided in ¼ at the time of a pulse-cancelling processing performed on the 1 bit P1, and (g) shows a phase compared output signal of the phase comparator 12 and offset voltage OFV at the time of a pulse-cancelling processing performed on the 1 bit P1.

When the phase of the input clock signal and the phase of the output clock signal match, the compared output signal of the phase comparator 12 in the case of no 1 bit P1 pulse-cancelling being performed on the input clock signal becomes a pulse signal of a duty of 50 percent as shown by (d) and by passing through the low pass filter 13 becomes the control voltage CV shown by the dot-dash line.

When performing a 1 bit P1 pulse-cancelling on the input clock signal, the phase compared output signal of the phase comparator 12 becomes a pulse signal of a duty of less than 50 percent as shown by (g) and the control voltage CV falls. Due to this, the frequency of the output clock signal of the voltage-controlled oscillator 11 falls. Therefore, up to this time, the offset voltage OFV is gradually added by the adder 25. Accordingly, there is only a very small change in the control voltage CV right after the 1-bit pulse-cancelling and therefore there is also only a slight phase change in the output clock signal of the voltage-controlled oscillator 11.

The counter means 22 in the pulse-cancelling control unit 20 is a 2-bit output counter as shown above for example and can successively change the control voltage CV of the voltage-controlled oscillator 11 over four stages. That is, the counter means 22 is incremented by the 4-bit divided pulse-cancelling request signals obtained by converting the pulse-cancelling request signal due to the pointer-action by the divider circuit 21. Accordingly, with the initial increment, the count is changed from "00" to "01" and the count is converted to an analog voltage by the D/A converter 23.

If the control voltage to be applied to the voltage-controlled oscillator 11 changes by 4V due to the 1 bit pulse-cancelling of the input clock signal, the D/A converter 23 converts the count of "01" to for example 1V. Accordingly, the 4V fall in the control voltage is suppressed to a change of 1V by adding the −1V offset voltage OFV and thereby the output clock signal of the voltage-controlled oscillator 11 is subjected to a control corresponding to a ¼ bit pulse-cancelling for a 1 bit pulse-cancelling of the input clock signal.

Next, the counter means 22 counts the 4-bit divided pulse-cancelling request signals. When the count reaches "10", the analog voltage from the D/A converter 23 is converted for example to 2V. In this case too, the control voltage of the voltage-controlled oscillator 11 is suppressed to a change of 1V compared with the previous time by the −2V offset voltage. When the count becomes "11" due to the next incrementation, the voltage from the D/A converter 23 is converted for example to 3V. Due to this, the control voltage CV is suppressed to a change of 1V compared with the previous time. Further, due to the next incrementation, the count becomes "00", so the output voltage of the D/A converter 23 is converted to 0V and the actual 1-bit pulse-cancelling processing is executed by the pulse-cancelling processing unit 15. After this, the count operation is stopped until the pulse-cancelling request signal due to the next pointer action is given.

That is, the control voltage CV for the voltage-controlled oscillator 11 is made to gradually change until the state of the 1 bit pulse-cancelling in advance of the processing for 1-bit P1 pulse-cancelling of the input clock signal. Due to this, it is possible to suppress jitter caused by a 1 bit pulse-cancelling without the use of a high speed input clock signal as in the past. Also, an explanation was made of the example of four stages as the number of stages, but the number of bits of the counter means 22 may be increased and the control voltage CV changed in more stages as well. Further, the period of the multi-bit divided pulse-cancelling request signals may be selected corresponding to the system in consideration of the period etc. until the next pointer-action occurs. Note that the above-mentioned function of the counter means 22 may also be achieved by use of other known configurations.

Figure 8:
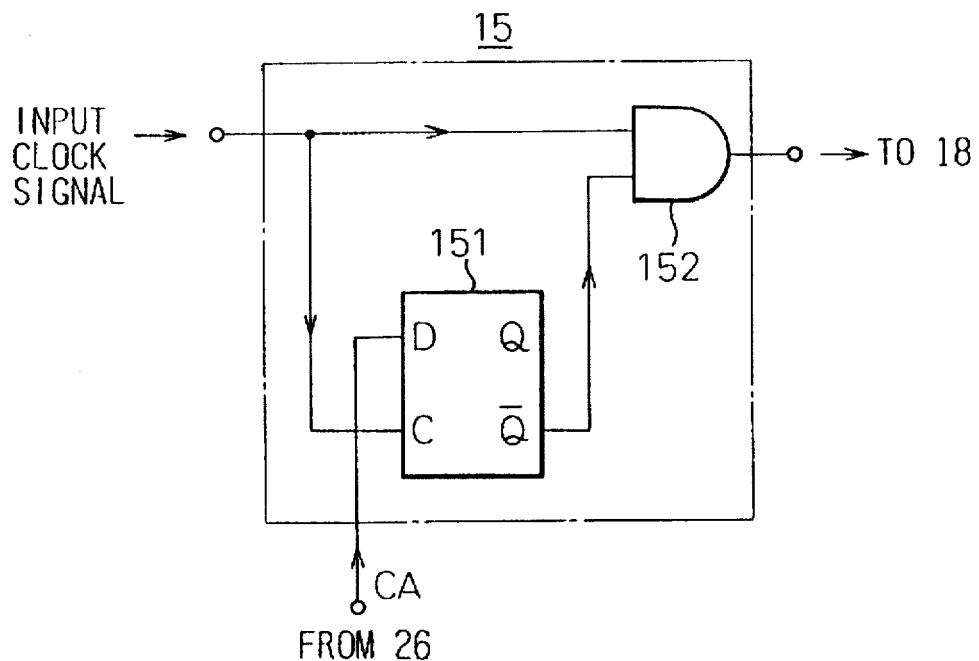
FIG. 8 is a view showing a specific example of the pulse-cancelling processing unit in FIG. 6.

FIG. 8 is a view showing a specific example of the pulse-cancelling processing unit in FIG. 6. In the figure, 151 is a D-flipflop which is provided with a data input D, a clock input C, and an inverting and non-inverting (Q) output, while 152 is an AND gate.

Usually, when receiving the inverting output (logic "1") from the D-flipflop 151, the AND gate 152 remains open and the input clock signal is applied as it is to the frequency dividing circuit 18.

On the other hand, when a pointer-action is generated and a carry-out output CA is generated from the counter means 22, a differentiation pulse from the differentiation circuit 26 is applied to the data input D of the D-flipflop 151. The inverting output of the same becomes the logic "0" at the bit timings of the input clock signal and the AND gate 152 closes. By this, application of 1 bit of the input clock signal to the frequency dividing circuit 18 is prohibited. The 1-bit pulse-cancelling processing of the input clock signal ends here.

Figure 9:
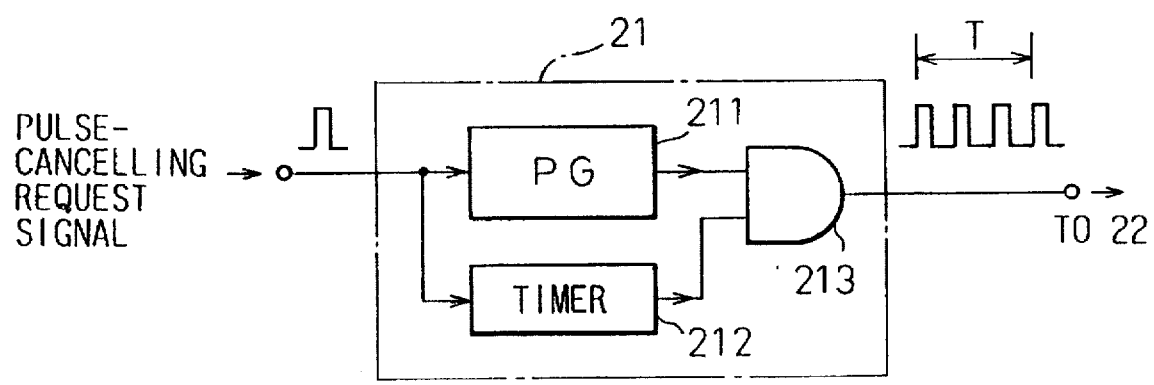
FIG. 9 is a view showing a specific example of the divider circuit in FIG. 6.

FIG. 9 is a view showing a specific example of the divider circuit in FIG. 6. However, this is merely one example.

In the figure, 211 is a pulse-generator (PG) producing self-generated pulses, 212 is a timer defining a time corresponding to four pulses of the pulse generator, and 213 is an AND gate.

When a pointer action is detected by the pointer receiving circuit (FIG. 2), a pulse-cancelling request signal is output. This signal is applied to the pulse generator 211 which is made to output the self-generated pulses and, at the same time, the timer 212 is triggered. In a predetermined period after the timer 212 is triggered, the AND gate 213 is opened. This predetermined period is made a period corresponding to four of the self-generated pulses. Therefore, multi-bit (4-bit) divided pulse-cancelling request signals are produced.

Figure 10:
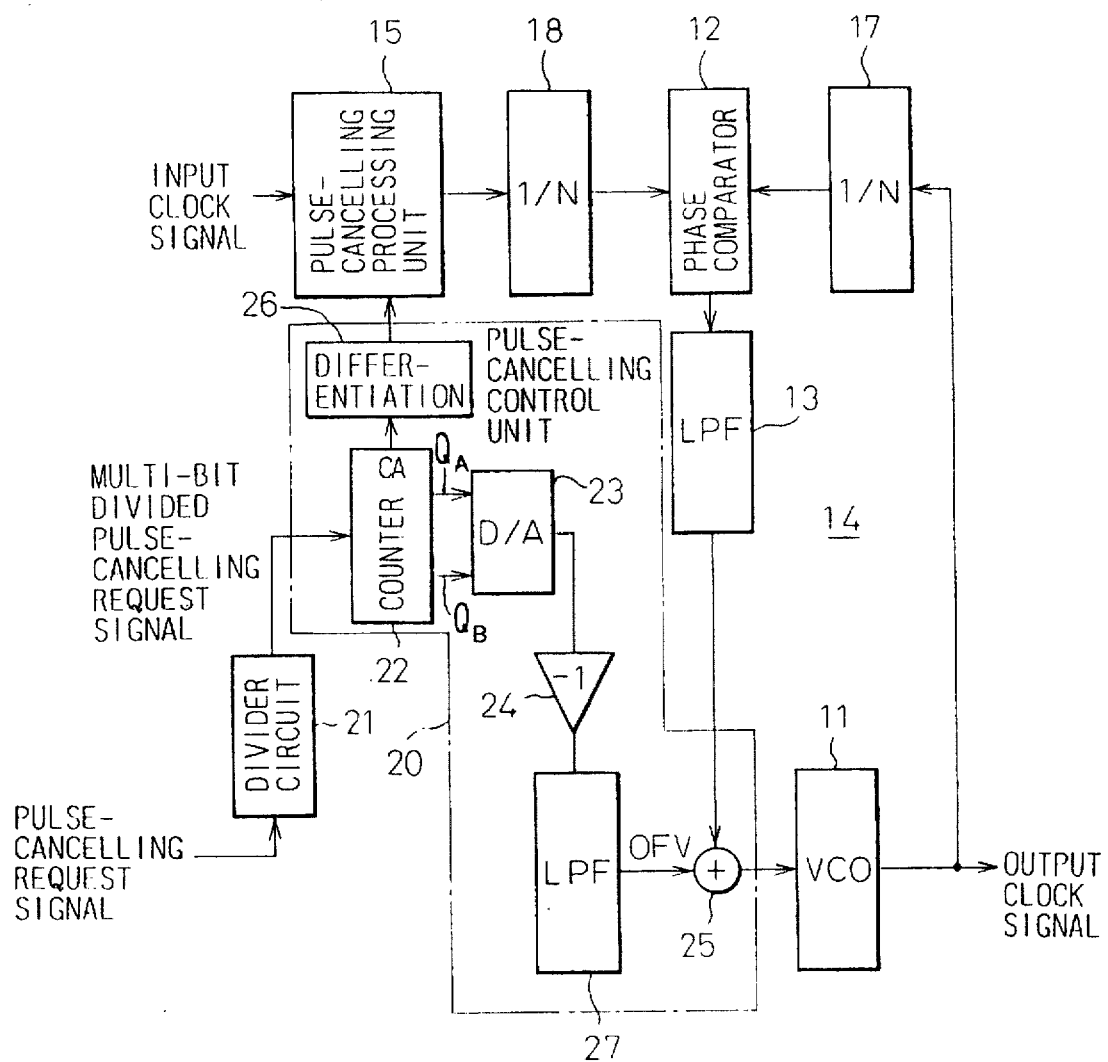
FIG. 10 is an explanatory view of a second embodiment of the present invention.

FIG. 10 is an explanatory view of a second embodiment of the present invention. References the same as in FIG. 6 indicate the same parts. A low-pass filter 27 is newly added.

A pulse-cancelling request signal due to a pointer action from the pointer receiving circuit shown in FIG. 2 becomes multi-bit divided pulse-cancelling request signals due to the divider circuit 21. Further, an offset voltage OFV produced through the counter means 22, the DA converter 23, the inverting buffer amplifier 24, and the low-pass filter 27 is added by the adder 25 to the control voltage CV obtained from the phase comparator 12 through the low pass filter 13 and is input to the voltage-controlled oscillator 11. Here, the control performed at the pulse-cancelling control unit 20 is similar to that of the first embodiment (FIG. 6), so any overlapping explanation is omitted.

Figure 11:
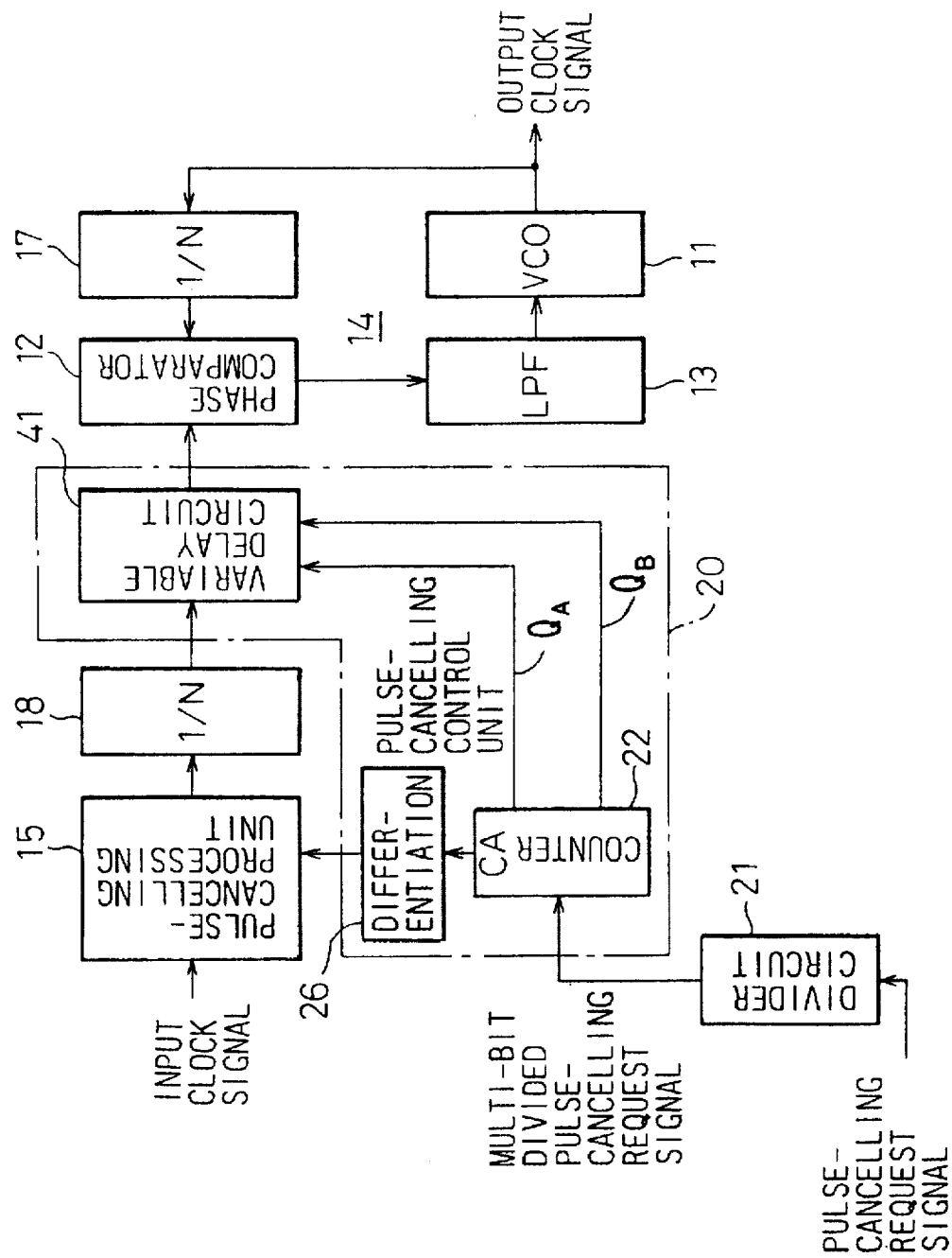
FIG. 11 is an explanatory view of a third embodiment of the present invention.

FIG. 11 is an explanatory view of a third embodiment of the present invention. Similar to the above embodiments, 11 is a voltage-controlled oscillator, 12 is a phase comparator, 13 is a low-pass filter, 14 is a phase locked loop circuit, 15 is a pulse-cancelling processing unit, 17 and 18 are frequency dividing (1/N) circuits, 20 is a pulse-cancelling control unit, 21 is a divider circuit, and 22 is a counter means. The characteristic of the third embodiment is the introduction of the variable delay circuit 41.

The variable delay circuit 41 usually has a delay time of 0, but is controlled in delay time through the counter means 22 by the multi-bit divided pulse-cancelling request signals after each pointer-action.

That is, the counter means 22 starts the control of the variable delay circuit 41 and changes the delay time over several stages such as T/4 to 2T/4 to 3T/4 before instructing a 1-bit pulse-cancelling processing to the pulse-cancelling processing unit 15. At the point of the maximum delay, it controls the pulse-cancelling processing unit 15 to cause it to perform a 1-bit pulse-cancelling processing on the input clock signal. Note that T is the period of the input clock signal. In this case, the phase-locked loop circuit 14 receives as input a clock signal accompanied with a phase change of ¼ of 1 bit, so no sudden change occurs in the phase of the output clock signal.

Figure 12:
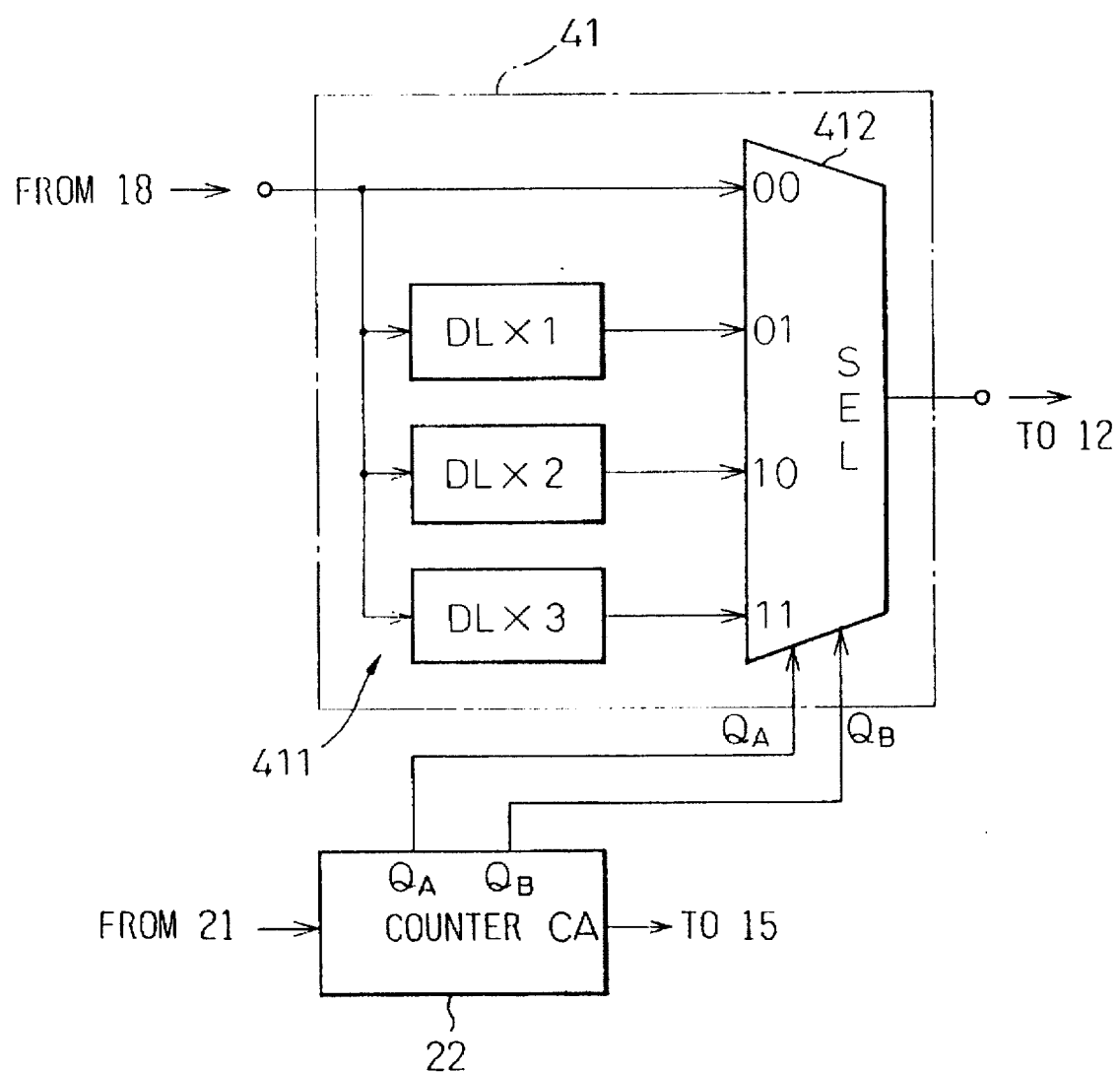
FIG. 12 is a view showing a specific example of a variable delay circuit shown in FIG. 11.

FIG. 12 is a view showing a specific example of a variable delay circuit shown in FIG. 11. In the figure, 411 shows three types of delay circuits and 412 a selector. The three types of delay circuits 411 receive in common the input clock signal coming through the frequency dividing circuit 18, but give different delays to them when outputting them. These different delays correspond to the above-mentioned T/4, 2T/4, and 3T/4.

The thus obtained input clock signals having different delays are successively selected by the sector 412 together with the incrementing of the counter means 22 and are output to the phase comparator 12. That is, along with the output ($Q_A$, $Q_B$) of the counter means 22 being incremented from (0,0) to (0,1) to (1,0), and to (1,1), input clock signals delayed by T/4, 2T/4, and 3T/4 are successively selected and output by the selector 412.

Figure 13:
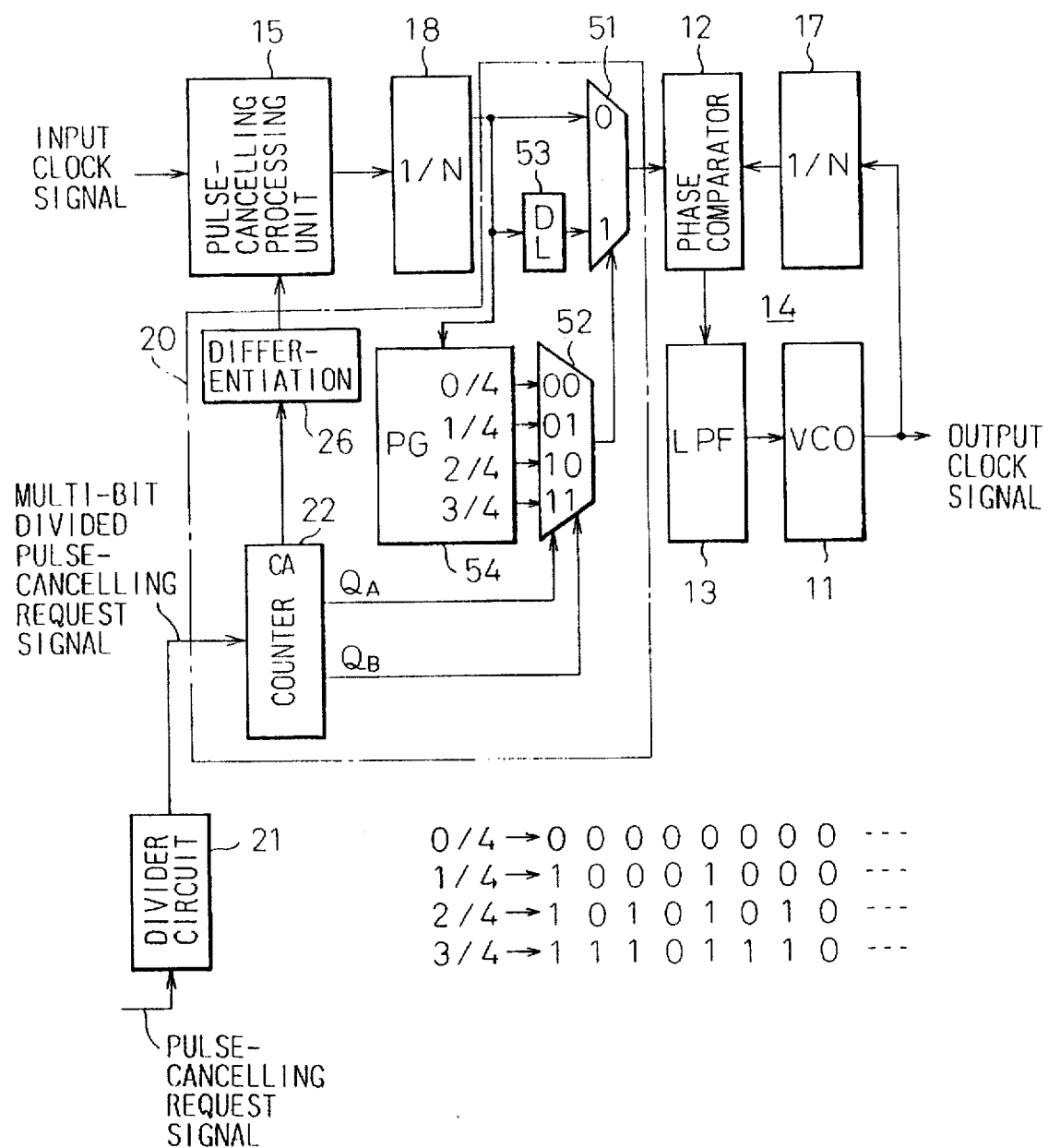
FIG. 13 is an explanatory view of a fourth embodiment of the present invention.

FIG. 13 is an explanatory view of a fourth embodiment of the present invention. In a similar way as in the embodiment explained above, 11 is a voltage-controlled oscillator, 12 is a phase comparator, 13 is a low-pass filter, 14 is a phase locked loop circuit, 15 is a pulse-cancelling processing unit, 17 and 18 are frequency dividing (1/N) circuits, 20 is a pulse-cancelling control unit, 21 is a divider circuit, 22 is a counter means, and 26 is a differentiation circuit.

The characteristic of the fourth embodiment is the introduction of the first selector 51, the second selector 52, the delay circuit (DL) 53, and the pattern generator (PG) 54.

The pattern generator 54, when for example outputting a repetitive pattern signal of four types of successively different mark rates, generates a repetitive pattern signal of a mark rate of 0/4 ("0000 . . . "), a repetitive pattern signal of a mark rate of 1/4 ("10001000 . . . "), a repetitive pattern signal of a mark rate of 2/4 ("10101010 . . . "), and a repetitive pattern signal of a mark rate of 3/4 ("11101110 . . . ").

Usually, the for example 2-bit output count of the counter 22 is "00", so the second selector 52 selects an all "0" repetitive pattern signal and uses this as the control signal of the first selector 51. Accordingly, the first selector 51 selects the input clock signal from the frequency dividing circuit 18 as it is and inputs it to the phase-locked loop circuit 14. The operation in this state is similar to that in the related art.

FIGS. 14A and 14B are explanatory views of a pulse-cancelling control of the fourth embodiment. The count, the mark ratio, and the repetitive pattern signal selected and output from the second selector 52 are in the relationship shown in FIG. 14A. That is, when the count of the counter means 22 is "00", the repetitive pattern signal of the mark rate 0/4 is selected and output by the second selector 52, when the count is "01", a repetitive pattern signal of the mark rate 1/4 is selected and output, when the count is "10", a repetitive pattern signal of the mark rate 2/4 is selected and output, and when the count is "11", a repetitive pattern signal of the mark ratio 3/4 is selected and output.

Referring to FIG. 14B, along with the generation of a pulse-cancelling request signal after a pointer-action, when 4-bit divided pulse-cancelling request signals are applied to the counter means 22 (second state II), this is incremented, the count becomes "01"=1, and a repetitive pattern signal of the mark rate 1/4 is selected and output from the second selector 52.

Accordingly, the ratio by which the input clock signal delayed by the delay circuit 53 is selected and output by the first selector 51 becomes 1/4. On an average, an input clock signal given a delay of T/4 is input to the phase-locked loop circuit 14. In the third state III, by counting the 4-bit divided pulse-cancelling request signals, the count of the counter means 22 becomes "10"=2 and the repetitive pattern signal of the mark rate 2/4 is selected and output from the second selector 52. By this, the ratio of the delayed input clock signal being selected and output from the first selector 51 becomes 2/4. On an average, an input clock signal given a delay of 2T/4 is input to the phase-locked loop circuit 14.

In the next fourth state IV, the count of the counter means 22 becomes "11"=3 and a repetitive pattern signal of a mark ratio 3/4 is selected and output from the second selector 52. By this, the ratio of the delayed clock signal selected and output from the first selector 51 becomes 3/4. On the average, an input clock signal delayed by 3T/4 is input to the phase-locked loop circuit 14.

Next, the count of the counter means 22 returns to the initial "00" (first state I), but at this time the pulse-cancelling processing unit 15 is controlled to perform the 1-bit pulse-cancelling processing on the input clock signal. The operation of the counter means 22 is stopped until a pulse-cancelling request signal is given by a next pointer-action. That is, using the 4-bit divided pulse-cancelling request signals, the delay time of the input clock signal is made successively larger and when the state of the 1-bit pulse-cancelling is approached, the 1-bit pulse-cancelling processing is made to be performed in the pulse-cancelling processing unit 15. In this way, the phase of the input clock signal input to the phase-locked loop circuit 14 is made to change over four stages, then the 1-bit pulse-cancelling processing is executed to prevent any sudden changes in the phase of the output clock signal.

The present invention is not limited to the only the above-mentioned embodiments and can be added to or modified in various ways. It may be configured with the frequency dividing circuits omitted and the phases of the input clock signal and the output clock signal from the voltage-controlled oscillator 11 being directly compared.

Further, when the frequencies of the input clock signal and the output clock signal differ, the invention can be applied by a configuration in which the frequency division ratio of the frequency dividing circuits differ.

As explained above, the present invention provides a construction wherein 1-bit pulse-cancelling processing is performed on an input clock signal in the pulse-cancelling processing unit 5 in accordance with a pulse-cancelling request signal after a pointer-action and the input clock signal is input to the phase locked loop circuit 14, wherein provision is made of a pulse-cancelling control unit 20 which causes the input phase to the phase-locked loop circuit 14 or the control voltage in the phase-locked loop circuit 14 to change over several stages from the state before the 1-bit pulse-cancelling to the state of the 1-bit pulse-cancelling before performing the 1-bit pulse-cancelling processing by the input clock signal, whereby it is possible to gradually synchronize the phase of the output clock signal to the phase of the 1-bit pulse-cancelled input clock signal in units of less than 1 bit without the use of a high speed clock signal. That is there is the advantage that the jitter is suppressed.

Further, in the 1-bit pulse-cancelling processing of the input clock signal, when an offset voltage OFV is added to the control voltage CV, it is possible to cause the phase of the output lock signal to gradually follow in units of less than 1 bit the 1-bit pulse-cancelling of the input clock signal and to thereby suppress jitter due to the 1-bit pulse-cancelling by just the addition of a minor construction.

Further, even if the delay time is changed by a fraction of the 1-bit period T of the input clock signal at a time, it is possible to gradually cause the phase of the input clock signal to the phase-locked loop circuit 14 to change over several stages and it is possible to cause the phase of the output clock signal to follow the 1-bit pulse-cancelling in units of less than 1 bit, so jitter can be suppressed.

We claim:

1. A control apparatus for suppressing jitter, induced by a pointer-action, provided with a pulse-cancelling processing unit which, when an input clock signal is received and said pointer-action is generated, receives a pulse-cancelling request signal given in response to that pointer-action and outputs the input clock signal after performing a 1-bit pulse-cancelling operation on said input clock signal, and a circuit for receiving as input the output from the pulse-cancelling processing unit and producing an output clock signal phase-locked to that output, that is, a phase-locked loop circuit comprised of a phase comparator for comparing the phases between the output and the output clock signal, a low-pass filter for receiving the output of the phase comparator and a voltage-controlled oscillator for receiving as the voltage-controlling input the output of the low-pass filter and producing the output clock signal, wherein further provision is made of

- a divider circuit which, when one pulse-cancelling request signal is given, divides said pulse-cancelling request signal into a consecutive number of bits and converts said bits into multi-bit divided pulse-cancelling request signals and
- a pulse-cancelling control unit which gradually changes the phase-locked state in the phase-locked loop circuit in several stages from the state before the 1-bit pulse-cancelling at the timings of the consecutive multi-bit divided pulse-cancelling request signals, wherein the pulse-cancelling control unit is provided with a counter means which receives the multi-bit divided pulse-cancelling request signals and successively sets a plurality of states for gradually changing the phase-locked state in the phase-locked loop circuit from the state before a 1-bit pulse-cancelled processing to the state of a 1-bit pulse-cancelling.

2. A control apparatus for suppressing jitter as set forth in claim 1, wherein the pulse-cancelling control unit is constituted so as to make the control voltage of the voltage-controlled oscillator a step-like offset voltage for gradually changing from the state before the 1-bit pulse-cancelling processing to the state of the 1-bit pulse-cancelling.

3. A control apparatus for suppressing jitter as set forth in claim 1, wherein the pulse-cancelling control unit is provided with a variable delay circuit set between the pulse-cancelling processing unit and the phase comparator in the phase-locked loop circuit, by which the input clock signal is successively delayed in a plurality of stages until 1-bit pulse-cancelled state, the 1-bit pulse-cancelling processing is performed at the pulse-cancelling processing unit in a 1-bit pulse-cancelled state, and the variable delay circuit is then returned to its original state.

4. A control apparatus for suppressing jitter as set forth in claim 1, wherein the pulse-cancelling control unit is provided with a first selector which selects and outputs either of the input clock signal from the pulse-cancelling processing unit delayed by a delay circuit or the input clock signal not so delayed, a pattern-generator for generating a plurality of types of repetitive patterns with successively different mark rates, and a second selector which selects and outputs one of the plurality of types of repetitive pattern signals from the pattern generator and uses the same as the selection control signal of the first selector, wherein by selection control of the second selector over several stages, the delayed input clock signal and the undelayed input clock signal are input to the phase-locked loop circuit in the ratio in accordance with a mark ratio from the first selector.

5. A control apparatus for suppressing jitter as set forth in claim 4, wherein the pulse-cancelling control unit successively raises over several stages a ratio of selection of the delayed input clock signal by the first selector, then performs 1-bit pulse-cancelling processing on the input clock signal at the pulse-cancelling processing unit and returns said ratio of selection of the delayed input clock signal to zero.

6. A control method for suppressing jitter, induced by a pointer-action in a control apparatus including: (i) a pulse-cancelling processing unit which, when an input clock signal is received and said pointer-action is generated, receives a pulse-cancelling request signal given in response to that pointer-action and outputs the input clock signal after performing a 1-bit pulse-cancelling operation with respect to said input clock signal, and (ii) a phase-locked loop circuit for receiving as input the output from the pulse-cancelling processing unit and producing an output clock signal phase-locked to that output, said phase-locked loop circuit having a phase comparator for comparing phases between the output and the output clock signal, a low-pass filter for receiving the output of the phase comparator, and a voltage-controlled oscillator for receiving as a voltage-controlling input an output of the low-pass filter and producing the output clock signal, the control method comprising the steps of:

- dividing, when said pulse-cancelling request signal is given, said pulse-cancelling request signal into a consecutive number of bits and converting the number of bits into consecutive multi-bit divided pulse-cancelling request signals and
- changing a phase-locked state in the phase-locked loop circuit gradually in several stages from a state before a 1-bit pulse-cancelling to a state of 1-bit pulse-cancelling at timings of the consecutive multi-bit divided pulse-cancelling request signals and, after this, performing said 1-bit pulse-cancelling operation.

* * * * *